US011930723B1

(12) United States Patent
Talin et al.

(10) Patent No.: US 11,930,723 B1
(45) Date of Patent: Mar. 12, 2024

(54) SYSTEMS AND METHODS FOR DYNAMICALLY RECONFIGURABLE ARTIFICIAL SYNAPSES AND NEURONS WITH TUNABLE ACTIVATION FUNCTIONS

(71) Applicant: National Technology & Engineering Solutions of Sandia, LLC, Albuquerque, NM (US)

(72) Inventors: Albert Alec Talin, Dublin, CA (US); Elliot James Fuller, Livermore, CA (US); Christopher Bennett, Albuquerque, NM (US); Tianyao Xiao, Albuquerque, NM (US); Matthew Marinella, Gilbert, AZ (US); Suhas Kumar, Mountain View, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 217 days.

(21) Appl. No.: 17/522,006

(22) Filed: Nov. 9, 2021

Related U.S. Application Data

(63) Continuation-in-part of application No. 16/854,151, filed on Apr. 21, 2020, now Pat. No. 11,450,802.

(51) Int. Cl.
*G11C 13/00* (2006.01)
*H10N 70/00* (2023.01)
*H10N 70/20* (2023.01)

(52) U.S. Cl.
CPC ....... *H10N 70/253* (2023.02); *G11C 13/0011* (2013.01); *G11C 13/004* (2013.01);
(Continued)

(58) Field of Classification Search
CPC .......... G11C 13/0011; G11C 13/004; H10N 70/253; H10N 70/8416; H10N 70/8833; H10N 70/8836
See application file for complete search history.

(56) References Cited

U.S. PATENT DOCUMENTS 10,429,343 B1   10/2019   Talin et al.
10,497,866 B1   12/2019   Fuller et al.
(Continued)

OTHER PUBLICATIONS

Kim, et al., "Metal-oxide based, CMOS-compatible ECRAM for Deep Learning Accelerator", In IEEE International Electron Devices Meeting, 2019, pp. 35.7.1-35.7.4.

*Primary Examiner* — Alfredo Bermudez Lozada
(74) *Attorney, Agent, or Firm* — Calfee, Halter & Griswold LLP; Madelynne J. Farber; Samantha Updegraff

(57) ABSTRACT

An ionic redox transistor comprises a solid channel, a solid reservoir layer, and a solid electrolyte layer disposed between the channel and the reservoir layer. The channel exhibits a substantially linear current-voltage relationship in a first range of voltages, and a nonlinear current-voltage relationship in a second range of voltages that is greater than the first range of voltages. One or both of the substantially linear current-voltage relationship or the nonlinear current-voltage relationship of the channel is varied by changing the concentration of ions such as oxygen vacancies in the channel. Ion or vacancy transport between the channel and the reservoir layer across the electrolyte layer occurs in response to applying a voltage between the channel and the reservoir layer. Subject to the first range of voltages, the channel can function as a synapse device. Subject to the second range of voltages, the channel can function as a neuron device.

20 Claims, 12 Drawing Sheets

(52) U.S. Cl.
CPC ....... *H10N 70/245* (2023.02); *H10N 70/8416* (2023.02); *H10N 70/8833* (2023.02); *H10N 70/8836* (2023.02); *G11C 2013/0045* (2013.01); *G11C 2213/53* (2013.01)

(56) References Cited

U.S. PATENT DOCUMENTS

| | | | |
|---|---|---|---|
| 2018/0331188 A1* | 11/2018 | Eom | H01L 29/7869 |
| 2020/0312911 A1* | 10/2020 | Ge | H10N 70/253 |
| 2021/0125043 A1* | 4/2021 | Bragaglia | G11C 13/0009 |

\* cited by examiner

US 11,930,723 B1

SYSTEMS AND METHODS FOR DYNAMICALLY RECONFIGURABLE ARTIFICIAL SYNAPSES AND NEURONS WITH TUNABLE ACTIVATION FUNCTIONS

RELATED APPLICATIONS

This application is a continuation-in-part of U.S. patent application Ser. No. 16/854,151, filed on Apr. 21, 2020, and entitled "THERMALLY SENSITIVE IONIC REDOX TRANSISTOR," the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Neuromorphic computing is an emerging area of computing technology that is well-suited to efficiently perform operations associated with artificial neural networks (ANNs). In theoretical neuromorphic computing devices, analog memory elements both process and store weights associated with neurons and/or synapses in an ANN. While software has been developed to emulate the functionality of ANNs using conventional digital computing devices, these conventional computing devices are not designed for efficient execution of ANNs at a hardware level. Thus, conventional digital computing devices are generally inefficient when executing ANNs relative to theoretical performance of a neuromorphic computing device.

Some analog memory devices have been proposed for use in neuromorphic computers. For instance, Resistive Random-Access Memory (RRAM) and phase change memory (PCM) have been proposed for use in neuromorphic computers. RRAM or PCM, however, require large voltages and large currents to program, and are additionally highly unpredictable and nonlinear. For example, it is difficult to program the memory cell into a desired analog state owing to nonuniform heating and electric fields. Additionally, such materials have low channel resistance, drawing micro-amperes of current during read operations per device and precluding scaling into large, energy-efficient arrays.

Analog memory devices described in U.S. Pat. Nos. 10,429,343 and 10,497,866 address some of these shortcomings of RRAM and PCM and exhibit substantially linear programming. These devices employ ion transport from an electrochemical gate layer to a channel layer to vary conductance of the channel responsive to voltage pulses input to the memory device. However, at micro- and nano-scale, these devices are prone to information loss within only a few seconds after programming, which is believed to be due to charge leakage through electronic switches used to control programming of the devices, which in turn causes ionic migration in the devices.

SUMMARY

The following is a brief summary of subject matter that is described in greater detail herein. This summary is not intended to be limiting as to the scope of the claims.

Various technologies pertaining to a thermally sensitive ionic redox transistor that is suited for analog neuromorphic computing are described herein. In an exemplary embodiment, a thermally sensitive ionic redox transistor comprises a variable-conductance solid channel, a solid electrolyte layer disposed in contact with the channel, and a solid reservoir layer that is disposed in contact with the electrolyte layer, such that the electrolyte layer is positioned between the channel and the reservoir layer. The redox transistor further comprises source and drain contacts that are positioned at opposite ends of the channel, and a gate contact that is positioned on an opposite end of the reservoir layer relative to the electrolyte layer. The ionic conductivity of one or more layers, or at the interfaces between layers, is thermally activated such that the ionic conductivity is high at elevated temperatures (e.g., between about 80° C. and about 300° C., between about 100° C. and about 250° C., or between about 125° C. and about 200° C.) and ions are mobile between the layers, and at low temperatures (e.g., less than 50° C., between about 0° C. and about 50° C., or between about 10° C. and about 50° C.) the conductivity is low and ions in the one or more layers are effectively immobile. Thus, as will be described in greater detail herein, at elevated temperatures, the device can be programmed, and at low temperatures, the device retains state for extended periods (e.g., about 10 days with less than 2% change in state value).

The channel is made up of an ionic material whereby certain ions are mobile at the elevated programming temperature; as used herein, the term "ions" includes interstitials and vacancies. By way of example, and not limitation, the channel can be composed of a nonstoichiometric transition metal oxide like titanium oxide, where the mobile ion is oxygen vacancies. Electronic conductance of the channel (e.g., conductance of the channel as measured between the source and drain contacts) varies with the concentration of ions in the channel layer, alternatively referred to herein as an oxidation state. The insertion or extraction of mobile ions (Li, Na, K, H, or oxygen vacancies, for example) is accompanied by the simultaneous insertion or extraction of electrons into the channel layer. The reservoir layer is also an ionic material which has the same mobile ion as the channel. A state of the redox transistor can be read by applying a voltage between the source and drain contacts, measuring a resultant current between the source and drain contacts, and computing a conductance or resistance of the channel based upon the applied voltage and the measured current.

The state of the redox transistor can be written by heating the redox transistor to an elevated temperature where the ionic conductivity of a layer is at least 100 times higher than the ionic conductivity of that layer at the low temperature state in one or more of the layers. As used herein, ions in the elevated-temperature (between about 80° C. and about 300° C., between about 100° C. and about 250° C., or between about 125° C. and about 200° C.) state are referred to as "mobile" and the ions in the low temperature state (less than 50° C., between about 0° C. and about 50° C., or between about 10° C. and about 50° C.) as "immobile." At elevated temperatures, applying a voltage pulse between the gate contact and at least one of the source or the drain contacts causes electrons to flow from the gate to the source/drain or vice versa. When the device is at low temperatures, the ionic conductivity of the ions in one or more of the materials is too low to allow substantial transport of the ions between the channel layer and the reservoir layer.

However, when the device is heated to the elevated temperature, application of the voltage pulse between the gate contact and at least one of the source or the drain contacts causes ions to move from the reservoir layer to the channel layer (or vice versa) as a result of the flow of electrons between the gate and the source or drain. Therefore, application of a voltage pulse between the gate contact and the source or drain contacts causes substantial changes in the conductance state of the channel layer only when the device is heated to the elevated temperature. The low ionic conductance of one or more of the layers when the device is at low temperatures also prevents information loss of the transistor (e.g., change of electronic conductance of the channel layer between the source contact and the drain contact) when the reservoir layer and the channel layer are electrically shorted (e.g., by shorting the gate contact with either of the source or the drain contacts).

Various embodiments described herein can be employed in a neuromorphic computing system as a synapse device or a neuron device with a tunable activation function. Furthermore, a same ionic redox transistor constructed in accordance with embodiments described herein can function as either a synapse device or a neuron device depending upon an operational voltage of the ionic redox transistor. For example, an ionic redox transistor described herein can have a channel layer that exhibits different current-voltage relationships in different operational voltage ranges. The ionic redox transistor can exhibit the different current-voltage relationships in the different operational voltage ranges for a same oxidation state of the channel layer. By way of example, for a same concentration of the ions in the channel layer, the channel layer can have a linear relationship between the current through the channel layer and the voltage across the channel layer for a first range of voltages, and a nonlinear relationship between the current through the channel layer and the voltage across the channel layer for a second range of voltages. Thus, a same ionic redox transistor can exhibit a current-voltage relationship associated with a synapse device (e.g., a substantially linear current-voltage relationship) and a current-voltage relationship associated with a neuron device (e.g., a substantially nonlinear current-voltage relationship).

The slope of the linear current-voltage relationship exhibited by the channel layer in response to application of a voltage in the first range of voltages serves as a weight of the ionic redox transistor when functioning as a synapse device. When an input voltage is applied across the channel layer, a current output from one of the source contact or the drain contact of the ionic redox transistor is proportional to the input voltage across the channel layer according to the weight. The slope of the linear current-voltage relationship exhibited by the channel layer in the first range of voltages is dependent upon a concentration of the ions in the channel layer. Accordingly, the synapse weight of an ionic redox transistor functioning as a synapse device can be controlled by appropriate writing of the state of the channel layer by controlling a voltage between the channel layer and a reservoir layer of the ionic redox transistor.

The nonlinear current-voltage relationship exhibited by the channel layer in response to application of a voltage in the second range of voltages can serve as an activation function of the ionic redox transistor when functioning as a neuron device. In an exemplary embodiment, the channel layer exhibits a nonlinear current-voltage relationship that includes a first inflection region and a second inflection region within the second range of voltages. Prior to the first inflection region, the channel layer exhibits a low rate of current rise in response to increasing voltage. At the first inflection region, the rate of current rise in response to increasing voltage increases. In other words, the slope of the current-voltage relationship of the channel layer increases at the first inflection region. In some embodiments, between the first inflection region and the second inflection region, the slope of the current-voltage relationship of the channel layer can be substantially constant. At the second inflection region, the slope of the current-voltage relationship of the channel layer decreases and again exhibits a low rate of current rise in response to increasing voltage. Thus, when operating within the second range of voltages, the redox ionic transistor functions as a neuron device that is activated by receipt of voltage signals that cumulatively exceed a voltage of the first inflection region. Responsive to receipt of such signals, the channel of the redox ionic transistor can pass a large output current (e.g., greater than or equal to 1 mA). Accordingly, the redox ionic transistor can function as a spiking neuron circuit.

In various embodiments, an ionic redox transistor that can function as either a synapse device or a neuron device can include a channel layer that is formed from vanadium dioxide, niobium dioxide, an alloy of vanadium dioxide, an alloy of niobium dioxide, one of various materials having a perovskite crystal structure, or a transition metal oxide. In some embodiments, the ionic redox transistor is thermally sensitive, such that ions present in one or more of the channel layer, the electrolyte layer, or the reservoir layer are mobile at an elevated temperature and immobile at a low temperature. In other embodiments, the ions of an ionic redox transistor described herein can be mobile between the reservoir layer and the channel layer (e.g., across the electrolyte layer) throughout an operational temperature range of the ionic redox transistor.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
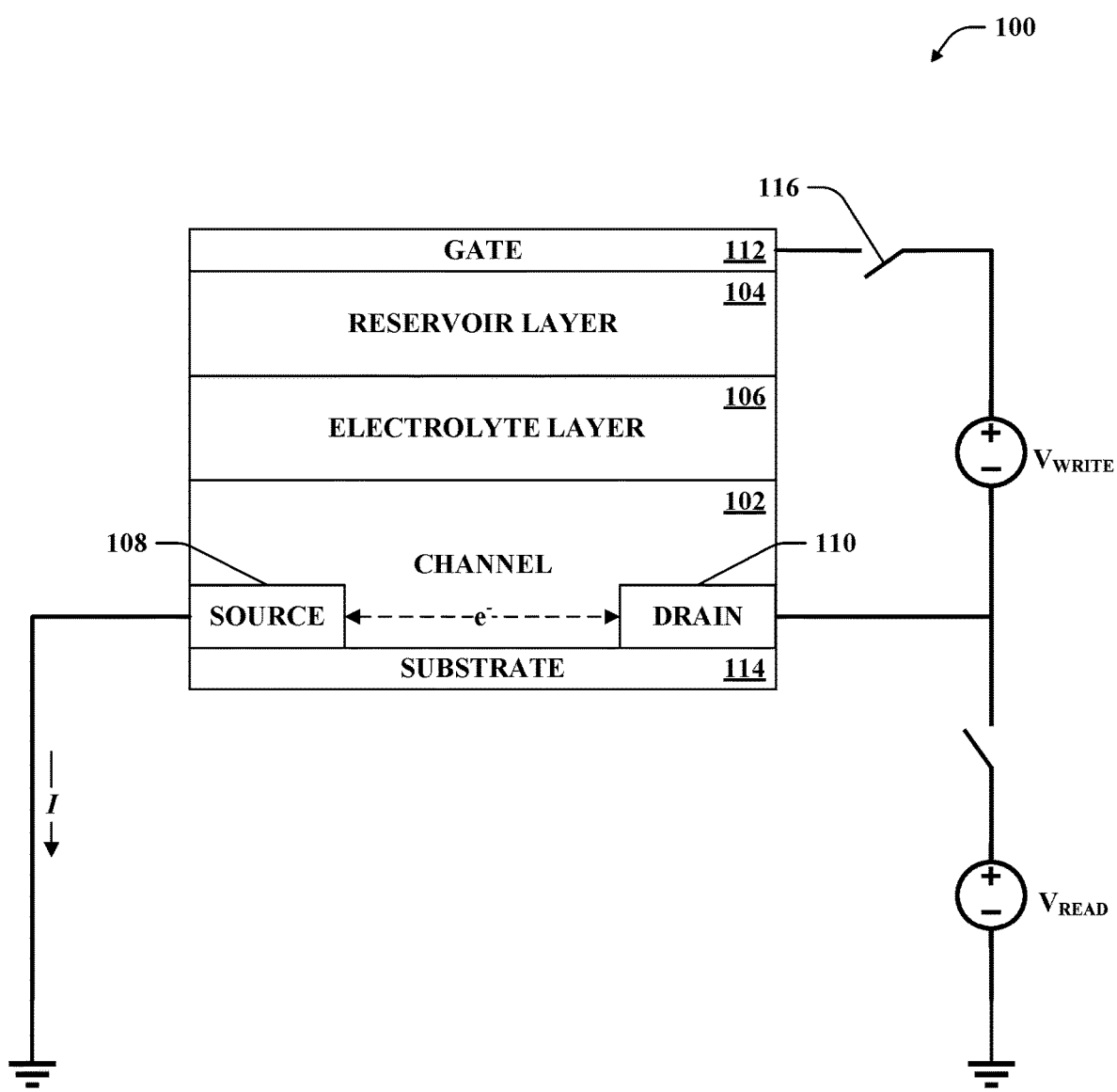
FIG. 1 is a diagram of an exemplary thermally sensitive ionic redox transistor.

Various technologies pertaining to a thermally sensitive ionic redox transistor are now described with reference to the drawings, wherein like reference numerals are used to refer to like elements throughout. Additionally, various technologies pertaining to ionic redox transistors that can be employed as a synapse device or a neuron device with a tunable activation function are described herein. It is to be understood that some embodiments described herein may be suitable for use as a thermally sensitive ionic redox transistor, but not as a tunable synapse/neuron device. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

It is to be understood that while certain terminology used herein is in common with conventional transistors (e.g., field-effect transistors, or FETs), including but not limited to the terms gate, source, and drain, such terms are not intended to imply commonality of function between elements of conventional transistors and the thermally sensitive ionic redox transistor described herein. By way of example, and not limitation, unlike various types of conventional transistors, the conductance of a channel of the redox transistor does not depend on a voltage being maintained at a gate electrode during operation of the redox transistor.

With reference now to FIG. 1, an exemplary thermally sensitive ionic redox transistor 100 is illustrated. The redox transistor 100 includes a solid channel layer 102, a solid reservoir layer 104, and a solid electrolyte layer 106 disposed between the channel layer 102 and the reservoir layer 104. The redox transistor 100 further includes a plurality of contacts 108-112 that facilitate integration of the transistor 100 with other electronic systems. The contacts 108-112 include a source contact 108, a drain contact 110, and a gate contact 112. In exemplary embodiments, the channel layer 102 of the redox transistor 100 can be deposited on a substrate 114. By way of example, the redox transistor 100 can be deposited on a substrate 114 of Si or $SiO_2$ in a CMOS-compatible manufacturing process.

The conductance of the channel 102 between the source 108 and the drain 110 contacts serves as a "state" of the redox transistor 100. As will be explained in greater detail herein, the redox transistor 100 is non-volatile such that for micro- and nano-scale devices, the conductance state of the channel 102 is retained for several days without continued energy input. The conductance of the channel 102 can be varied by a "write" operation and the present conductance of the channel 102 can be measured by way of a "read" operation, as will be described in greater detail below. The redox transistor 100 can further be used as a neuromorphic computing element that applies a weight to a signal input to the redox transistor 100 based on the present conductance state of the redox transistor 100. A current output at one of the source 108 or the drain contacts 110 is a product of the conductance of the channel 102 and a value of a voltage input to the other of the source 108 or the drain 110. Thus, a current output by the redox transistor 100 can be considered a weighted function of the present conductance state of the redox transistor 100.

The channel 102 comprises a mixed ionic and electronic conductor (MIEC) material that has an electrical conductance that varies as a function of the bulk concentration of ions in the channel layer 102. The conductance of the channel 102 can be modulated by transport of ions into and out of the channel 102. The reservoir layer 104 comprises a MIEC material that can readily accept ions from or donate ions to the channel layer 102. In an exemplary embodiment, the channel layer 102 and the reservoir layer 104 each comprise non-stoichiometric titanium dioxide, or $TO_{2-\delta}$. Besides $TO_{2-\delta}$, introduction of ion vacancies increases electronic conductivity in many other nonstoichiometric transition metal oxides such as for example (but not limited to) $WO_{3-\delta}$, $MoO_{3-\delta}$, and alloys of transition metal oxides. In such embodiments, each of the channel layer 102 and the reservoir layer 104 are crystalline layers having a plurality of oxygen vacancies formed therein. In further embodiments, the channel layer 102 and the reservoir layer 104 can be or include materials based on the fluorite structure such as $CeO_{2-\delta}$, materials based on the perovskite structure such as $LaMnO_{3-\delta}$, or amorphous films such as hafnium oxide.

Exchange of ions between the channel layer 102 and the reservoir layer 104 occurs by way of the electrolyte layer 106. At least one of the layers 102-106 has an ionic conductivity with respect to ions in the channel layer 102 and the reservoir layer 104 that is at least 100 times greater at elevated temperature (between about 80° C. and about 300° C., between about 100° C. and about 250° C., or between about 125° C. and about 200° C.) than at low temperatures (less than 50° C., between about 0° C. and about 50° C., or between about 10° C. and about 50° C.). At low temperatures, ionic conductivity is sufficiently low in at least one of the layers 102-106 that ions are substantially unable to migrate between the channel layer 102 and the reservoir layer 104. When the redox transistor 100 is heated to an elevated temperature, each of the layers 102-106 has sufficiently high ionic conductivity with respect to ions present in the channel layer 102 and the reservoir layer 104 to allow the ions to migrate between the channel 102 and the reservoir layer 104. By way of example, and not limitation, the electrolyte layer 106 can comprise yttria-stabilized zirconia (YSZ) when the channel layer 102 and the reservoir layer 104 are composed of materials that include mobile oxygen vacancies. In other examples, the electrolyte layer can comprise $CeO_2$ or $SrTiO_3$.

Figure 2:
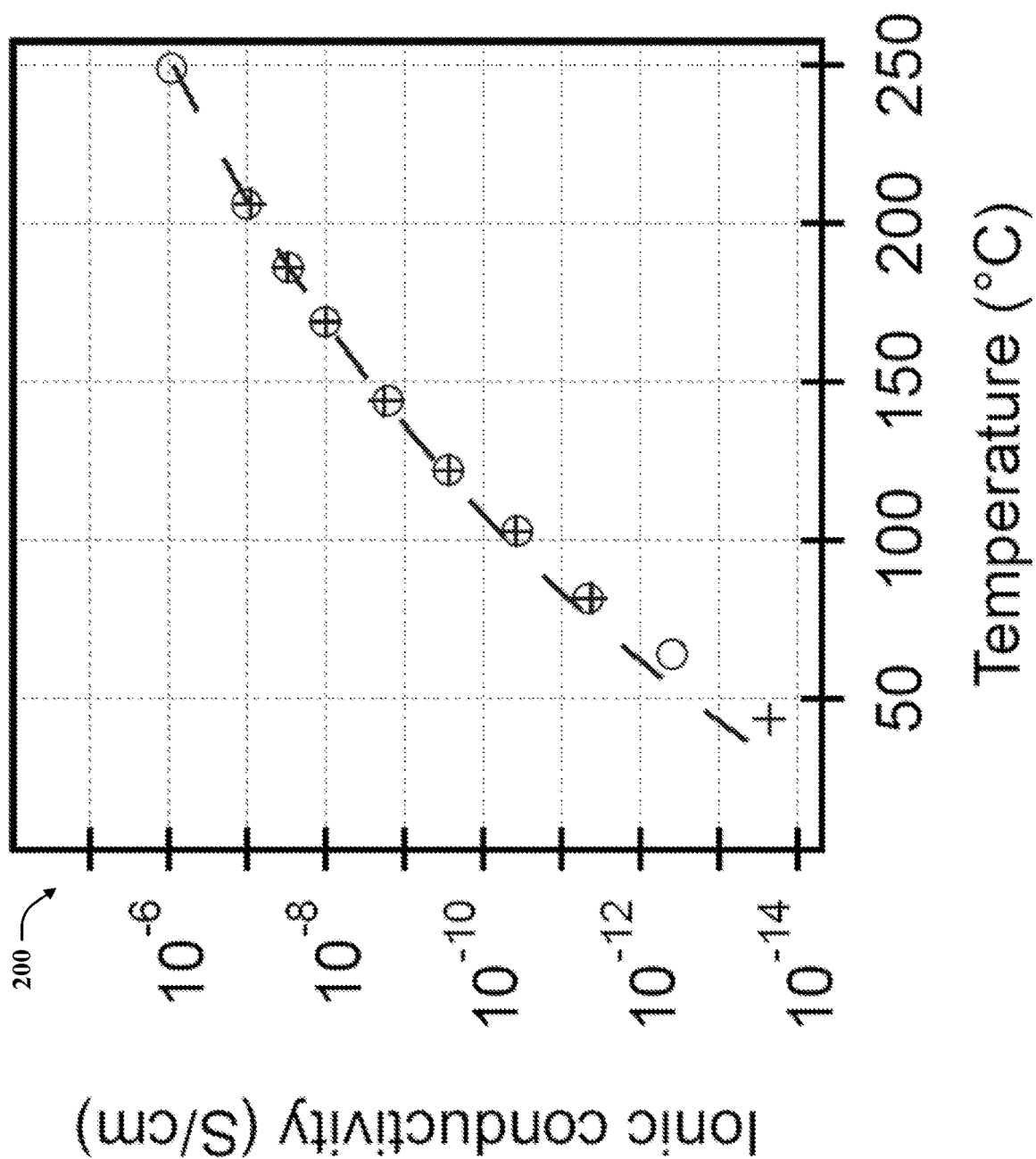
FIG. 2 is a plot of ionic conductivity of yttria-stabilized zirconia (YSZ) versus temperature.

Referring now to FIG. 2, a plot 200 of measurements of ionic conductivity of YSZ at temperatures ranging from about 50° C. to about 250° C. is illustrated. As indicated by the plot 200, the ionic conductivity of YSZ increases as temperature increases in a substantially continuous, albeit nonlinear fashion. In YSZ, the ionic conductivity at 25° C. is about $10^{-14}$ S/cm, the conductivity at 90° C. is about $10^{-11}$ S/cm (1000 times higher than room temperature), and the conductivity at 200° C. is about $10^{-7}$ S/cm. In one exemplary embodiment of the redox transistor 100, the channel layer 102 and the reservoir layer 104 comprise $TiO_{2-\delta}$ and the electrolyte layer 106 comprises YSZ. These materials are generally compatible with CMOS fabrication techniques such as various types of physical or chemical vapor deposition. The redox transistor 100 described herein is therefore suitable for manufacturing in existing fabrication facilities using well-understood manufacturing methods, and is further suitable for integration into other existing CMOS-compatible devices.

For some materials, such as YSZ, temperature-variant ionic conductivity results from increased ion vacancy mobility at higher temperatures. For other materials, temperature-variant ionic conductivity may result from increased vacancy concentration in the electrolyte layer 106 at higher temperatures. In a non-limiting example, the electrolyte layer 106 can comprise strontium titanate ($SrTiO_3$).

A write procedure to modify the conductance state of the redox transistor 100 is now described. Write performance of the redox transistor 100 is substantially linear and symmetric, yielding predictable change of conductance state of the redox transistor 100 without a priori knowledge of the present state of the redox transistor 100. As noted above, the conductance of the channel 102 can be varied by control of transport of ions between the channel 102 and the reservoir layer 104. Migration of ions between the channel 102 and the reservoir layer 104 across the electrolyte layer 106 occurs in response to movement of electrons (i.e., electric current) between the channel 102 and the reservoir layer 104. Accordingly, conductance of the channel 102 can be changed in response to voltage pulses being applied between the reservoir layer 104 and the channel 102 (or between metallic contacts in contact with the reservoir 104 and the channel 102, such as the gate 112 and source 108 contacts, respectively). By way of example, a voltage $V_{WRITE}$ applied between the gate contact 112 and the source contact 108 causes an electric current to flow between the channel 102 and the reservoir layer 104.

However, migration of ions across the electrolyte layer 106 is limited by the ionic conductivity of the layers 102-106 with respect to ions present in the channel layer 102 and the reservoir layer 104. At low temperatures, at least one of the layers 102-106 is substantially non-conductive (e.g., at least 100 times less conductive than when the redox transistor 100 is heated to the temperature of the write procedure) to ions present in the channel layer 102 and the reservoir layer 104 that are responsible for the electronic conductance of the channel layer 102. Accordingly, at low temperatures, application of voltage pulses at $V_{WRITE}$ will not cause sufficient ion migration between the channel layer 102 and reservoir layer 104 to substantially change the conductance state of the channel 102. Thus, at low temperatures, the conductance state of the channel 102 is substantially invariant responsive to voltage pulses at $V_{WRITE}$. The conductance state will not degrade when switch 116 is leaky (e.g., permits electrical current to flow even when the switch is "open"), or even when switch 116 does not exist and there exists a direct electronic path from the reservoir 104 to the channel 102, because ion migration from the channel 102 to the reservoir layer 104 is effectively blocked when the redox transistor 100 is at low temperatures.

During a write operation, a change in conductance of the channel 102 exhibits a linear dependence on the number of ions, and the electrons that accompany these ions such that the channel maintains its electroneutrality, that migrate into or out of the channel 102. A number of ions that migrate into or out of the channel 102 responsive to a voltage pulse applied at $V_{WRITE}$ depends upon a magnitude and duration of the voltage pulse, but also exhibits a linear relationship. Thus, two voltage pulses of equal magnitude and duration cause a substantially same change in conductance of the channel 102. Furthermore, pulses of equal duration and equal but opposite magnitude cause substantially equal but opposite changes in the conductance of the channel 102.

Figure 3:
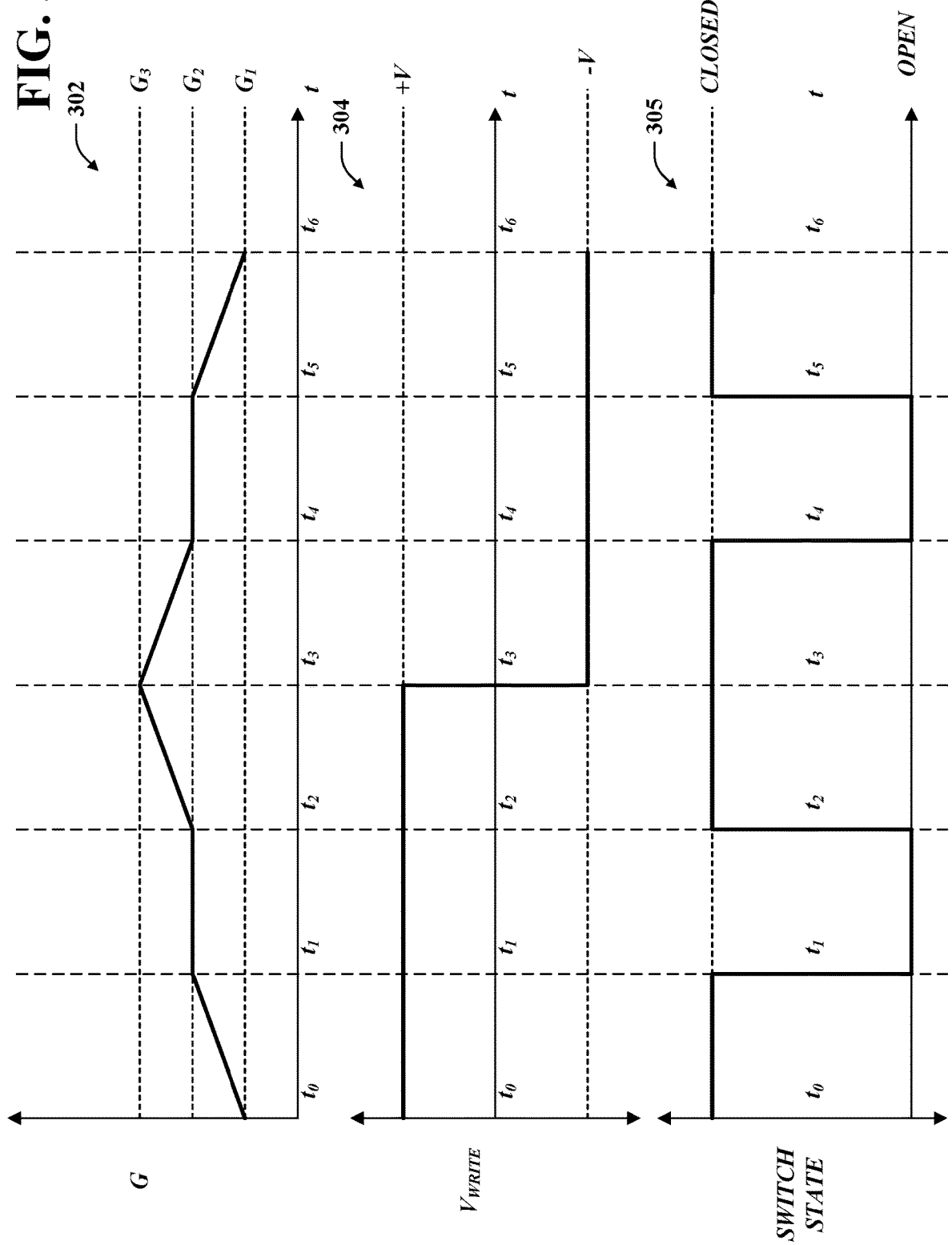
FIG. 3 illustrates corresponding conceptual channel conductance, write-voltage, and switch state diagrams with respect to a thermally-sensitive ionic redox transistor.

To illustrate further, and referring now to FIG. 3, a conceptual channel conductance plot 302, an exemplary $V_{WRITE}$ voltage plot 304, and a plot 305 of a state of the switch 116 are illustrated, which together illustrate certain write performance features of the redox transistor 100 when the redox transistor 100 is heated to an elevated temperature. Time is depicted on the x-axis of the plots 302, 304, 305. Conductance G of the channel 102 is depicted on the y-axis of the channel conductance plot 302. The voltage $V_{WRITE}$ that is applied between the gate 112 and the drain 110 is depicted on the y-axis of the $V_{WRITE}$ voltage plot. The state of the switch 116, closed or open, is depicted on the y-axis of the switch state plot 305. From time $t_0$ to time $t_1$, the voltage $V_{WRITE}$ takes the value V and the switch 116 is closed, such that there is a drop in electric potential from the reservoir 104 to the channel 102. As a result, in the same period, the conductance of the channel 102, G, undergoes a substantially linear change from $G_1$ to $G_2$ as ions migrate into or out of the channel 102, which direction of migration may depend upon whether the ions are n- or p-type dopants, a material-dependent factor. While the conductance G of the channel 102 is depicted in the plot 302 as increasing in response to a positive value of voltage $V_{WRITE}$, it is to be understood that whether the conductance G increases or decreases in response to a voltage will depend on whether the voltage causes ions to migrate into or out of the channel layer 102. From $t_1$ to $t_2$, the switch 116 is open, and the conductance G does not change. Once a concentration of ions in the channel 102 is set by way of application of a voltage pulse between the source contact 108 and the gate contact 112, the conductance of the channel 102 remains stable until another voltage pulse is applied between the drain 110 and the gate 112. Thus, when no voltage is applied, the conductance of the channel 102 stays constant. From $t_2$ to $t_3$ the voltage $V_{WRITE}$ takes the value V again and the switch 116 is closed, and the conductance G undergoes another substantially linear increase from $G_2$ to $G_3$. Since the same voltage is applied for the same duration, the conductance increase from $G_2$ to $G_3$ is substantially the same magnitude as the conductance increase from $G_1$ to $G_2$ (e.g., ±5%). From $t_3$ to $t_4$, the voltage $V_{WRITE}$ takes the value $-V$, equal and opposite to the magnitude of the voltage $V_{WRITE}$ from time $t_2$ to $t_3$. In the same period $t_3$ to $t_4$, since the switch 116 is closed the conductance G undergoes a substantially linear decrease from $G_3$ to $G_2$. Thus, two voltage pulses at $V_{WRITE}$ of the same duration and equal but opposite magnitudes yield conductance changes that cancel one another. In the period $t_4$ to $t_5$, the conductance G does not change since the switch 116 is open and thus there is no $V_{WRITE}$ applied between the reservoir layer 104 and the channel 102. From $t_5$ to $t_6$, the voltage $V_{WRITE}$ continues to take the value $-V$ and the switch 116 is closed, and thus the conductance G decreases from $G_2$ to $G_1$. As will be understood by those of skill in the art in view of the present disclosure, the change in conductance of the channel 102 resulting from a voltage pulse $V_{WRITE}$ is not substantially dependent on the present conductance state of the channel 102. Furthermore, a conductance change in the channel 102 can be reversed by application of a voltage pulse having opposite polarity to the pulse used to initially cause the conductance change.

Figure 4:
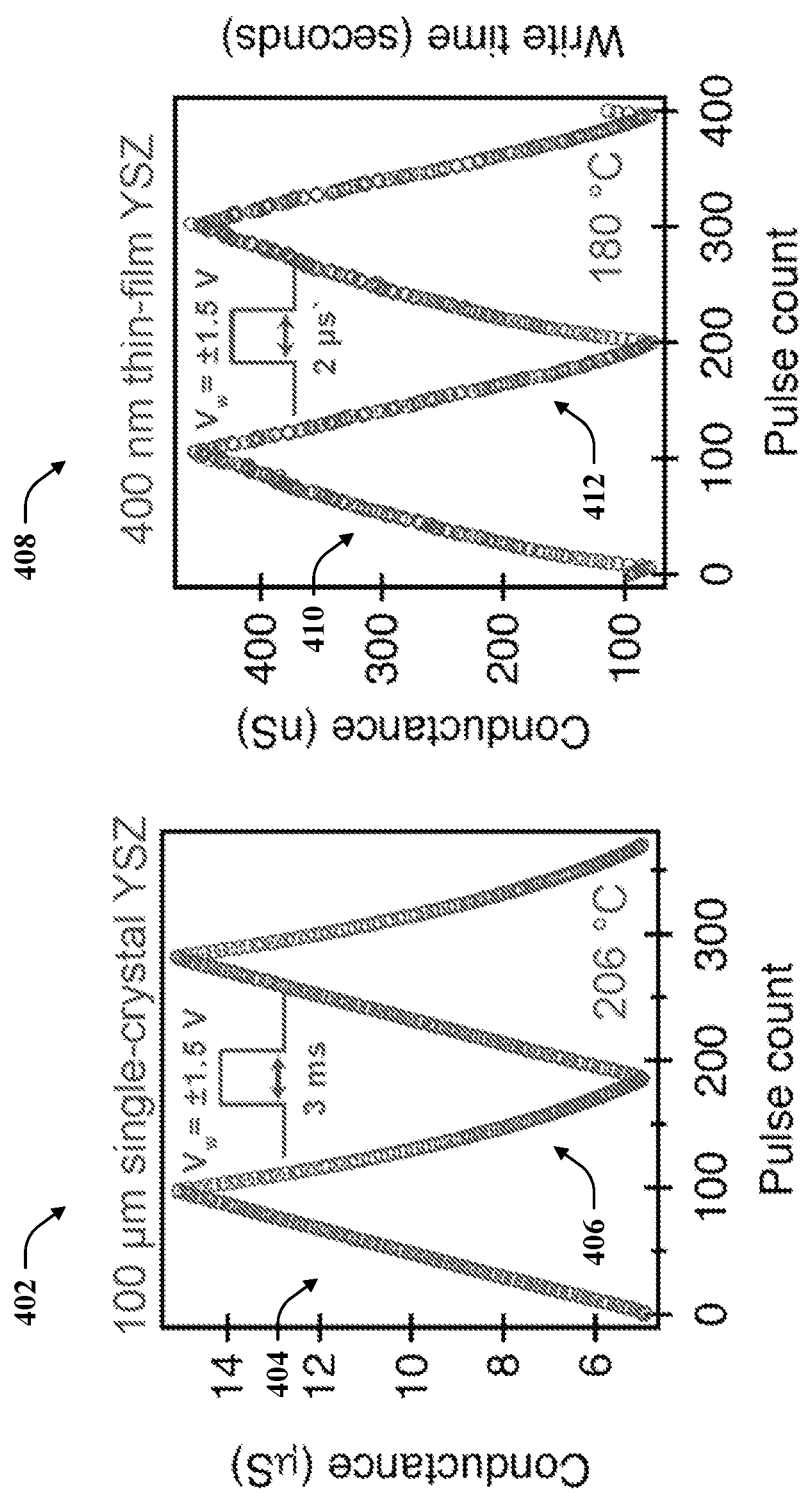
FIG. 4 depicts experimental conductance values of certain exemplary embodiments of a thermally-sensitive ionic redox transistor in response to voltage pulses.

Referring now to FIG. 4, experimental results of channel conductance plotted versus voltage pulse count for two different thermally-sensitive ionic redox transistors are shown, confirming substantially linear and symmetric channel conductance modulation. A first channel conductance plot 402 depicts channel conductance of a thermally-sensitive ionic redox transistor having a single-crystal YSZ electrolyte of 100 micron thickness, plotted against pulse count for a plurality of pulses $V_{WRITE}$ of magnitude ±1.5V and duration of 3 ms applied while the redox transistor was heated to a temperature of 206° C. As can be seen from a first rising edge 404 of the conductance plot 402, approximately 90 pulses at positive $V_{WRITE}$=1.5 V increased conductance of the channel 102 from approximately 5 µS to approximately 15 µS. Similarly, on a falling edge 406 of the conductance plot 402, approximately 90 pulses of opposite magnitude at $V_{WRITE}$ decreased conductance of the channel 102 from approximately 15 µS to approximately 5 µS.

A second channel conductance plot 408 depicts channel conductance of a thermally-sensitive ionic redox transistor having a 400-nanometer-thick thin-film YSZ electrolyte. Voltage pulses $V_{WRITE}$ of magnitude ±1.5V and duration of 2 µs were applied while the redox transistor was heated to a temperature of 180° C. A rising edge 410 of the plot 408 illustrates that approximately 100 pulses increased the channel conductance from less than 100 nS to approximately 450 nS. A falling edge 412 of the plot 408 illustrates that approximately 100 pulses of opposite magnitude decreased the channel conductance from approximately 450 nS to less than 100 nS. Experimental results have indicated that several hundred distinguishable analog conductance states (e.g., greater than 100, greater than 200, or greater than 500) can be written to the redox transistor 100 described herein, and these states reliably retained for periods of days after the device is cooled to low temperatures when the gate 112 is shorted to the source 108 or the drain 110 (i.e., such that the reservoir 104 and channel 102 layers are electrically shorted).

The write time required to change the resistance or conductance state of the channel 102 by a given amount depends at least in part upon the thickness of the electrolyte layer 106 (e.g., where the thickness refers to a thickness of the electrolyte layer 106 between the reservoir layer 104 and the channel layer 102). Thus, in some embodiments it may be desirable that the electrolyte layer 106 is relatively thin (e.g., between 100 nanometers and 1 micron) in order to improve a response time over which the conductance of the channel 102 changes in response to a voltage pulse $V_{WRITE}$. Experimental results indicate that the write time required to change conductance state of the channel 102 depends further on the temperature of the redox transistor 100. In general, a higher temperature yields a lower write time for a given value of conductance state change. It is to be understood that for a given voltage pulse value, the write time required to reach a desired conductance state in the channel 102 will vary depending on a current conductance state of the channel 102.

After the conductance of the channel layer 102 is set to a desired state by way of the write procedure described above, the temperature of the redox transistor 100 can be reduced to a temperature below the elevated temperature (e.g., room temperature) in order to improve retention of the channel conductance state. Subsequently, the conductance state of the channel layer 102 can be read by applying a voltage $V_{READ}$ between the source 108 and the drain 110, and measuring a current I that flows from the source to the drain. The conductance of the channel 102 can be computed by application of Ohm's law wherein the channel conductance G is equal to $I/V_{READ}$. Channel resistance between the source 108 and the drain 110 on the order of tens to hundreds of MΩ was observed in experimental measurements of micro- and nano-scale embodiments of the thermally-sensitive ionic redox transistor 100.

Figure 5B:
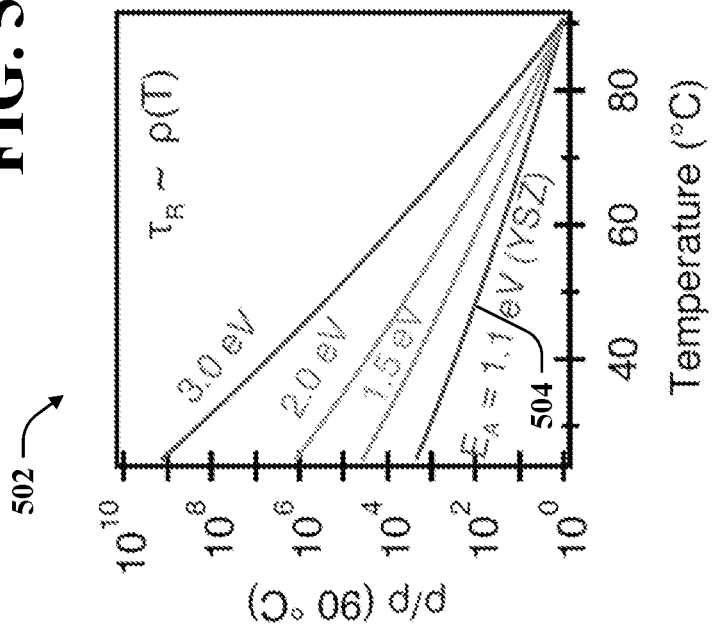
FIG. 5B is an exemplary plot of the ratio of the retention time of thermally-sensitive redox transistors to the retention time at 90° C. plotted against temperature for various electrolytes.
Figure 5A:
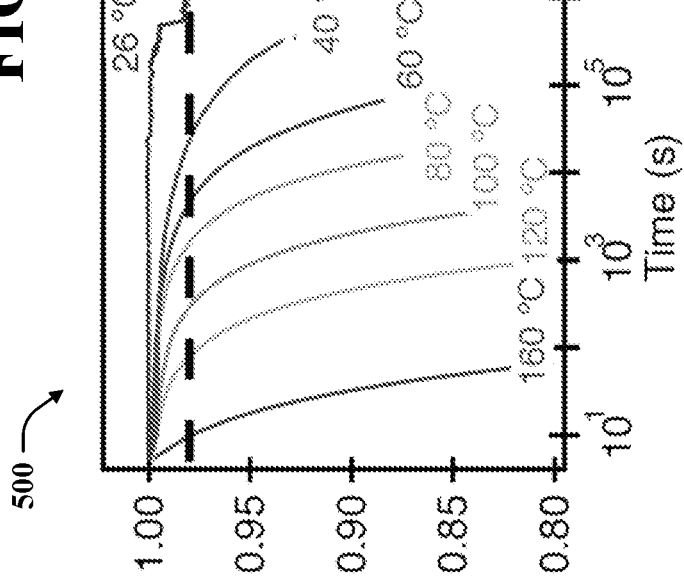
FIG. 5A is an exemplary plot of experimental results of channel conductance of a thermally-sensitive redox transistor normalized to an initial conductance state value plotted versus time.

Thermally-sensitive redox transistors constructed in accordance with the present disclosure have been shown to retain state for extended periods (e.g., several days) at room temperature. By way of example, and with reference now to FIG. 5A, a plot 500 of experimental results of channel conductance of a thermally-sensitive redox transistor normalized to an initial conductance state value plotted versus time is shown for a plurality of temperatures. As the plot 500 indicates, the conductance state of the channel 102 of the thermally-sensitive redox transistor 100 decays more slowly at lower temperatures. In one embodiment, a thermally-sensitive redox transistor 100 was shown to experience less than 2% degradation in channel conductance after 10 days at a temperature less than 50° C. (e.g., approximately 25° C.). Thus, the thermally-sensitive redox transistor 100 described herein exhibits substantially improved state retention performance as compared to other redox transistors, which exhibit state loss after only several seconds in micro- and nano-scale devices.

Further, higher activation energies of ions can provide a higher ratio of the elevated-temperature retention time to the low temperature retention time. By way of further example, and with reference now to FIG. 5B, a plot 502 of the ratio of the retention time (which is proportional to the ionic resistance) of a thermally sensitive redox transistor to the retention time at 90° C. is shown plotted against temperature for electrolytes having various activation energies. Stated differently, the plot 502 depicts a factor by which retention time is increased as temperature is decreased below 90° C. By way of example, the lowest line 504 of the plot 502 shows that an embodiment wherein the electrolyte layer 106 is composed of YSZ, which has an oxygen vacancy activation energy of about 1.1 eV, exhibits a retention time more than 100 times greater at 40° C. than at 90° C. Accordingly, electrolytes made up of perovskites such as $CaTiO_3$ or $CaZrO_3$, with ion activation energies on the order of about 3 eV, may provide the thermally-sensitive redox transistor 100 with much longer state retention times than electrolytes made up of YSZ, which has an oxygen vacancy activation energy of about 1.1 eV.

Figure 6:
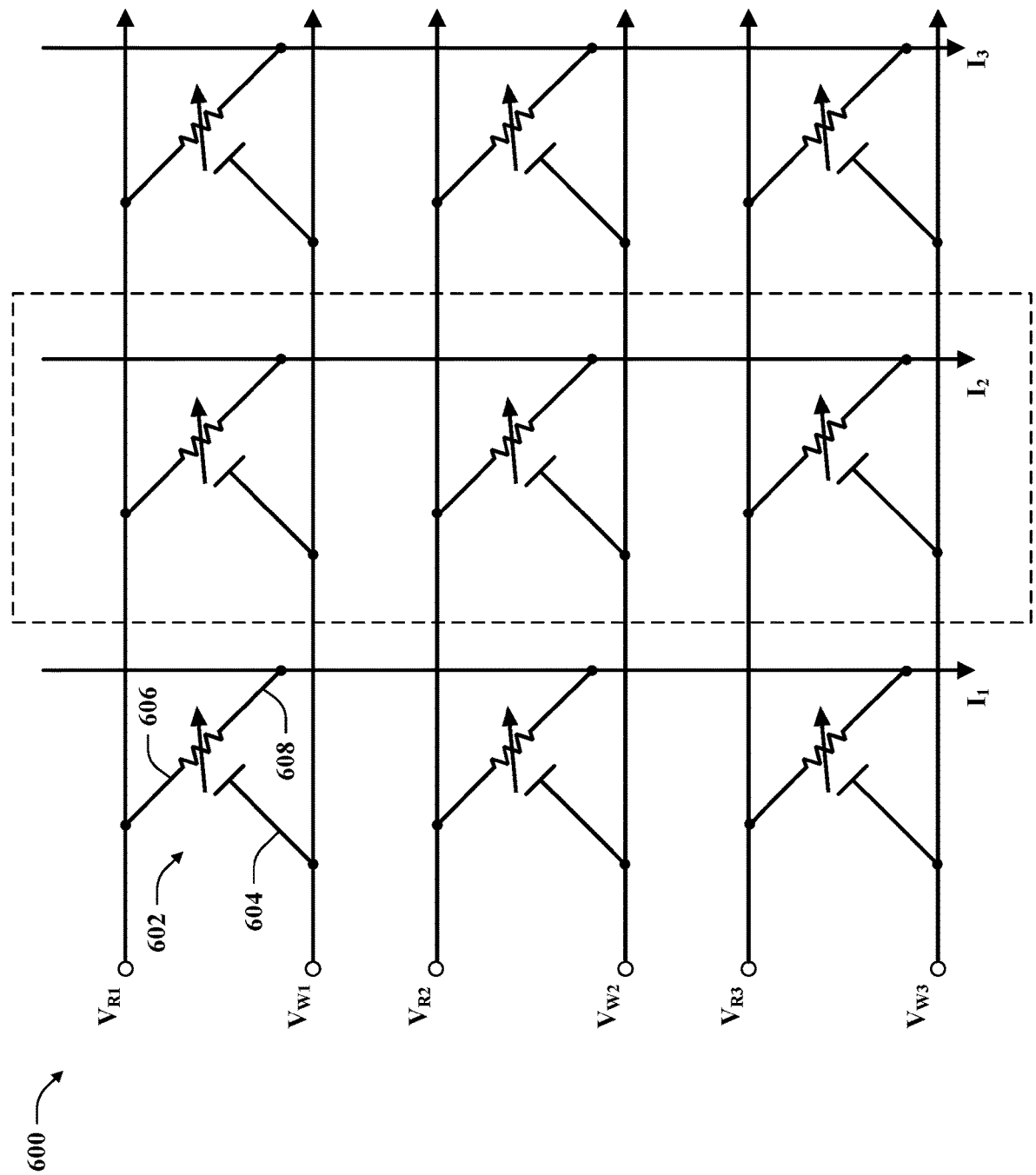
FIG. 6 is a partial circuit diagram of an exemplary crossbar memory device that incorporates a thermally-sensitive ionic redox transistor.
Figure 7:
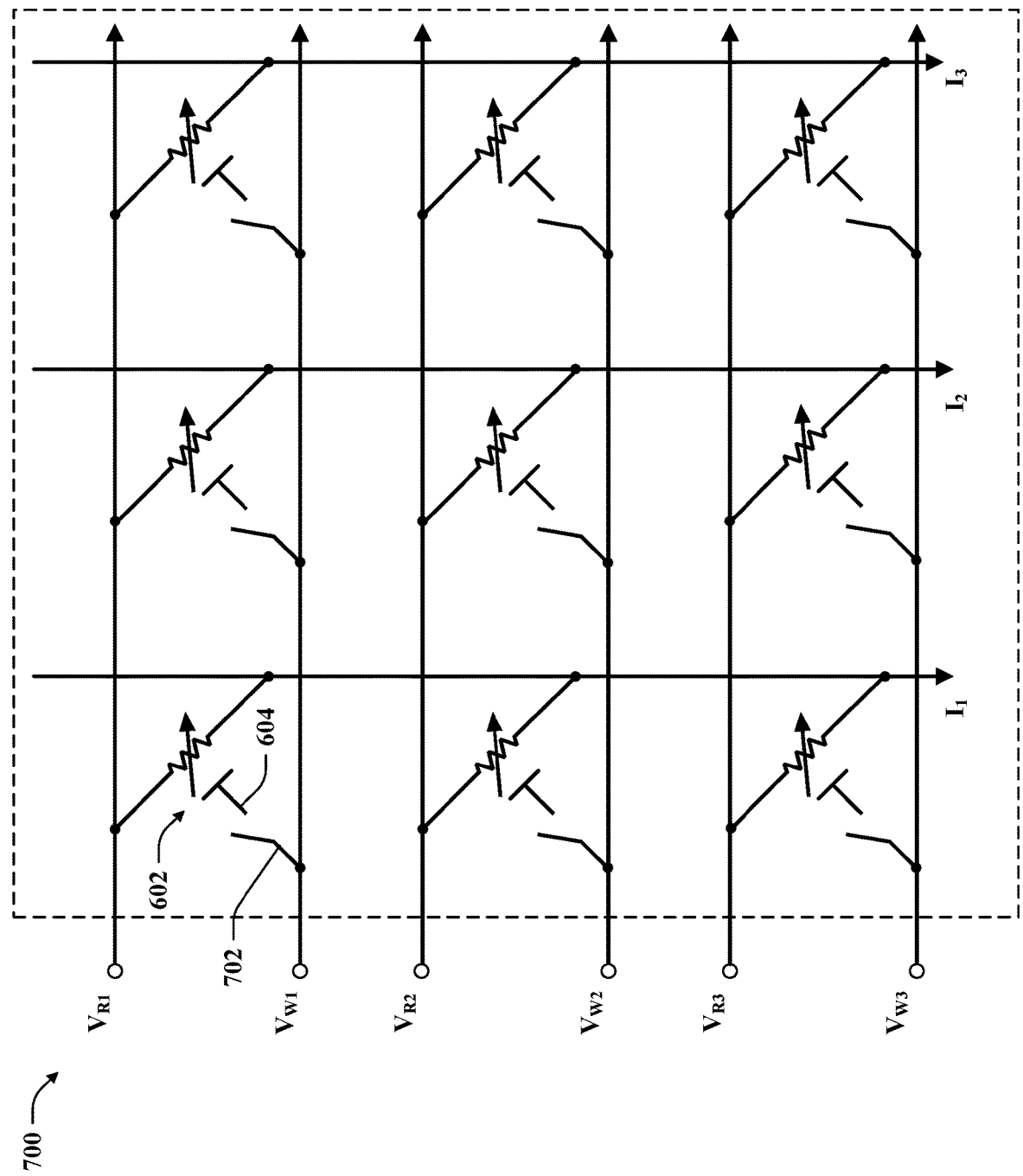
FIG. 7 is a partial circuit diagram of another exemplary crossbar memory device that incorporates a thermally-sensitive ionic redox transistor.

Referring now to FIG. 6, a partial circuit diagram of an exemplary crossbar memory array 600 that incorporates thermally-sensitive ionic redox transistors 602 is shown. The memory array 600 is a 3×3 array addressable by 3 voltage write lines $V_{W1}$-$V_{W3}$ and 3 voltage read lines $V_{R1}$-$V_{R3}$. It is to be understood that while the crossbar memory array 600 shown in FIG. 6 (and similarly, a crossbar memory array 700 shown in FIG. 7) is a 3×3 array, principles described herein are applicable to arrays of substantially any size. The write lines $V_{W1}$-$V_{W3}$ are connected to gate contacts 604 of the redox transistors 602 along rows of the array 600. The read lines $V_{R1}$-$V_{R3}$ are connected to either sources or drains 606 of the redox transistors 602 along rows of the array 600. Current collector lines $I_1$-$I_3$ are connected to the other of the sources or drains 608 along columns of the array 600. Each of the gates 604 of the redox transistors 602 is connected to the same voltage write line as the other redox transistors 602 in its row, either its source or drain 606 is connected to the same voltage read line as the other redox transistors 602 in its row, and the other of its source or drain 608 is connected to the same current collector line as the other redox transistors 602 in its column. A conductance state of a redox transistor 602 in the array 600 can be read by applying a voltage to the voltage read line of the row that corresponds to the redox transistor 602 and measuring the current of the collector line of the column that corresponds to the redox transistor 602. The conductance state can then be determined by an application of Ohm's law given the known write voltage and measured collector line current.

In the crossbar memory array 600, columns of redox transistors 602 can be selectively heated to an elevated temperature, one column at a time. An individual redox transistor 602 can therefore be written by heating the column that corresponds to the redox transistor 602 and then applying a write voltage pulse or pulses at the voltage write line of the row that corresponds to the redox transistor 602. Since the state of a redox transistor 602 of the array 600 is only changed when the redox transistor 602 is both heated to an elevated temperature and pulsed at its gate contact 604 by a voltage pulse, heating a single column and energizing a single voltage write line of the array 600 uniquely identifies a single element of the array 600 for a write operation.

If a memory array is heated in its entirety rather than selectively, a different means of selecting a redox transistor for writing a conductance state to a single redox transistor in the array can be used. By way of example, and referring now to FIG. 7, a partial circuit diagram of an exemplary crossbar memory array 700 that includes the redox transistors 602 is shown, wherein each of the redox transistors 602 is further addressed for writing by way of a selector switch 702 that is positioned between the gate contact 604 of the redox transistor 602 and its voltage write line (e.g., $V_{W1}$). In the array 700, read operations occur in the same manner as described above with respect to the array 600 of FIG. 6. To perform a write operation with respect to one of the redox transistors 602 of the array 700, the array 700 is heated to an elevated temperature. The voltage write line corresponding to the row of the desirably addressed redox transistor 602 is energized with a desired write voltage. The selector switch 702 of the redox transistor 602 is then closed to apply the write voltage to the gate 604 of the redox transistor 602. In order to simplify addressing of elements in the array 700, selector switches 702 of redox transistors 602 in the same column of the array 700 can be collectively controlled such that switches 702 in the same column of the array 700 are closed and reopened by a single control signal. Thus, to perform a write operation of a redox transistor 602 in the array 700, the voltage write line of the row corresponding to the redox transistor 602 can be energized, and the selector switches of the column corresponding to the redox transistor 602 can be closed.

Figure 8:
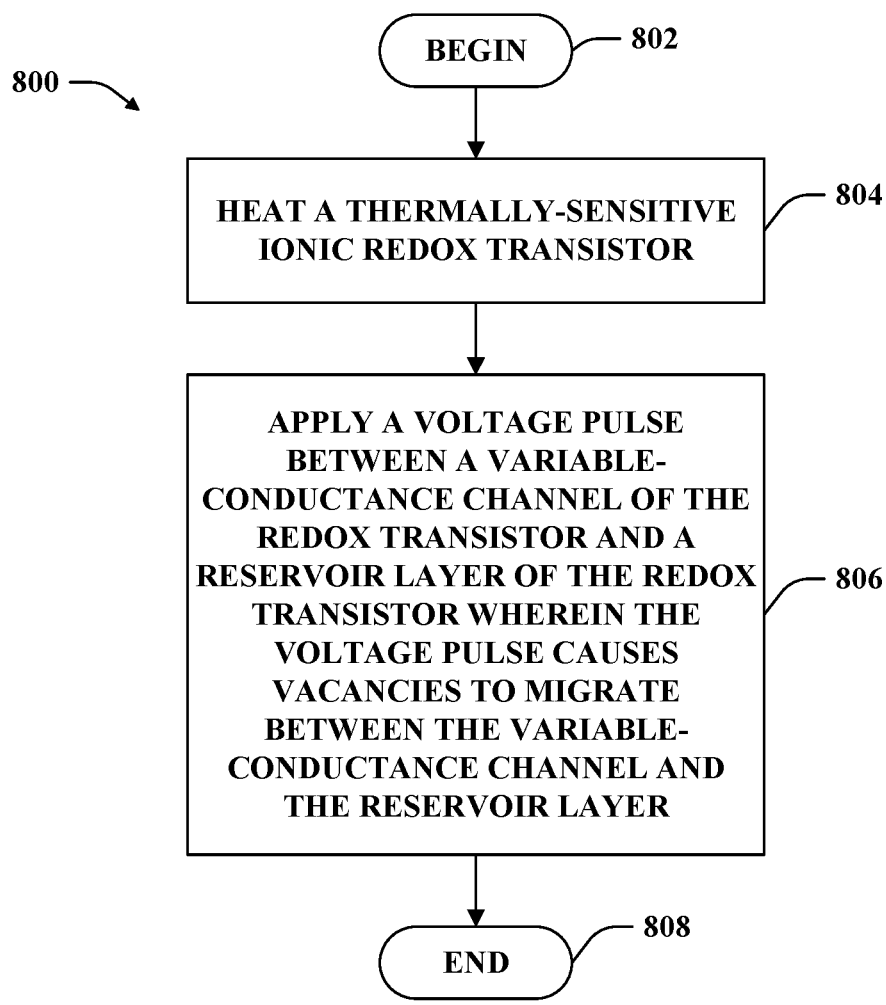
FIG. 8 is a flow diagram that illustrates an exemplary methodology for performing a write operation with respect to a thermally-sensitive ionic redox transistor.
Figure 9:
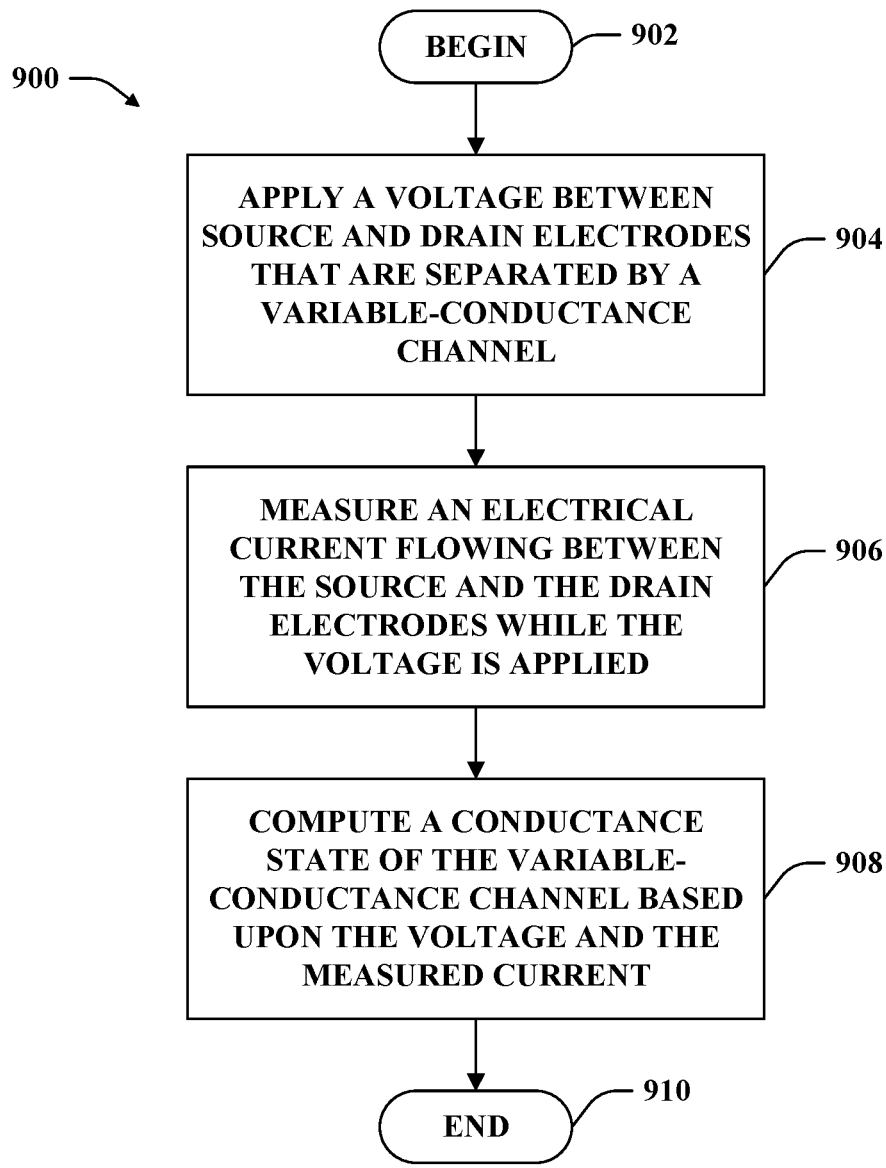
FIG. 9 is a flow diagram that illustrates an exemplary methodology for performing a read operation with respect to a thermally-sensitive ionic redox transistor.
Figure 12:
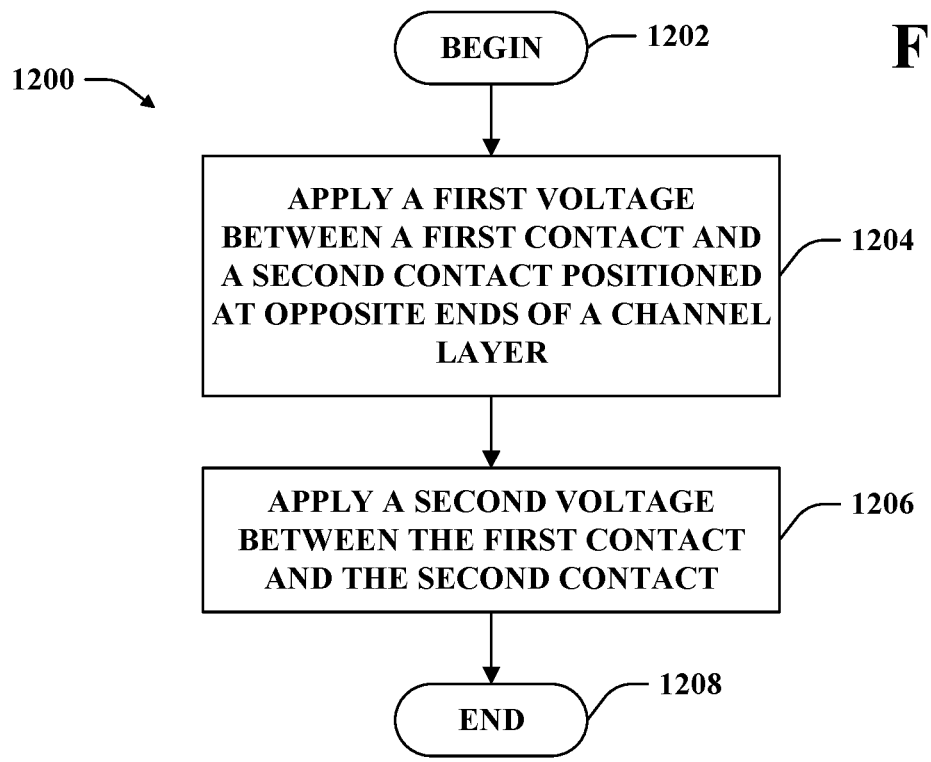
FIG. 12 is a flow diagram that illustrates an exemplary methodology for operating a same ionic redox transistor as a synapse device and a neuron device.

FIGS. 8 and 9 illustrate exemplary methodologies relating to writing and reading conductance states of a thermally-sensitive ionic redox transistor, respectively. FIG. 12 illustrates an exemplary methodology relating to operating an ionic redox transistor as both a synapse device and a neuron device. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now to FIG. 8, a methodology 800 that facilitates writing a conductance state to a thermally-sensitive ionic redox transistor is illustrated. The methodology 800 begins at 802, and at 804 a thermally-sensitive ionic redox transistor (e.g., the redox transistor 100) is heated to an elevated temperature. While the redox transistor is at the elevated temperature, at 806 a voltage pulse is applied between a variable-conductance channel of the redox transistor and a reservoir layer of the redox transistor, wherein the voltage pulse causes ions to migrate between the channel and the reservoir layer. The migration of ions in turn causes an increase or decrease in the conductance of the channel layer. The step 806 can be repeated as many times as required to reach a desired conductance state of the channel of the redox transistor. The methodology 800 then completes 808.

Referring now to FIG. 9, a methodology 900 that facilitates reading a conductance state of a thermally-sensitive ionic redox transistor (e.g., the redox transistor 100) is illustrated. The methodology 900 begins at 902, and at 904 a voltage is applied between source and drain contacts of the redox transistor, which are separated by a variable-conductance channel. At 906, an electrical current flowing between the source and the drain contacts is measured while the voltage is being applied 904. At 908, a conductance state of the channel of the redox transistor is computed based upon the voltage applied at 904 and the current measured at 906, by application of Ohm's law. The methodology 900 ends at 910.

Referring once again to FIG. 1, the ionic redox transistor 100 can, in various embodiments, be configured to selectively function as either a synapse device or a neuron device. By way of example, and not limitation, the ionic redox transistor 100 is constructed such that the channel layer 102 exhibits a first current-voltage relationship when a voltage in a first range of voltages is applied between the source 108 and the drain 110, and a second current-voltage relationship when a voltage in a second range of voltages is applied between the source 108 and the drain 110. In these embodiments, the channel layer 102 is configured to undergo an insulator-metal transition (IMT) in response to a sufficiently large electrical stimulus. Thus, below a threshold voltage at which an IMT occurs in the channel layer 102 (e.g., in the first range of voltages), the channel layer 102 exhibits a first current-voltage relationship. Above the threshold voltage at which the IMT occurs (e.g., in the second range of voltages), the channel layer 102 exhibits a second current-voltage relationship. With greater specificity, the first current-voltage relationship can be a substantially linear current-voltage relationship (e.g., such that for each voltage in the first range of voltages, a corresponding current is within 10%, 5%, or 1% of a linear expected value of the current). The second current-voltage relationship can be a nonlinear current-voltage relationship.

Figure 10:
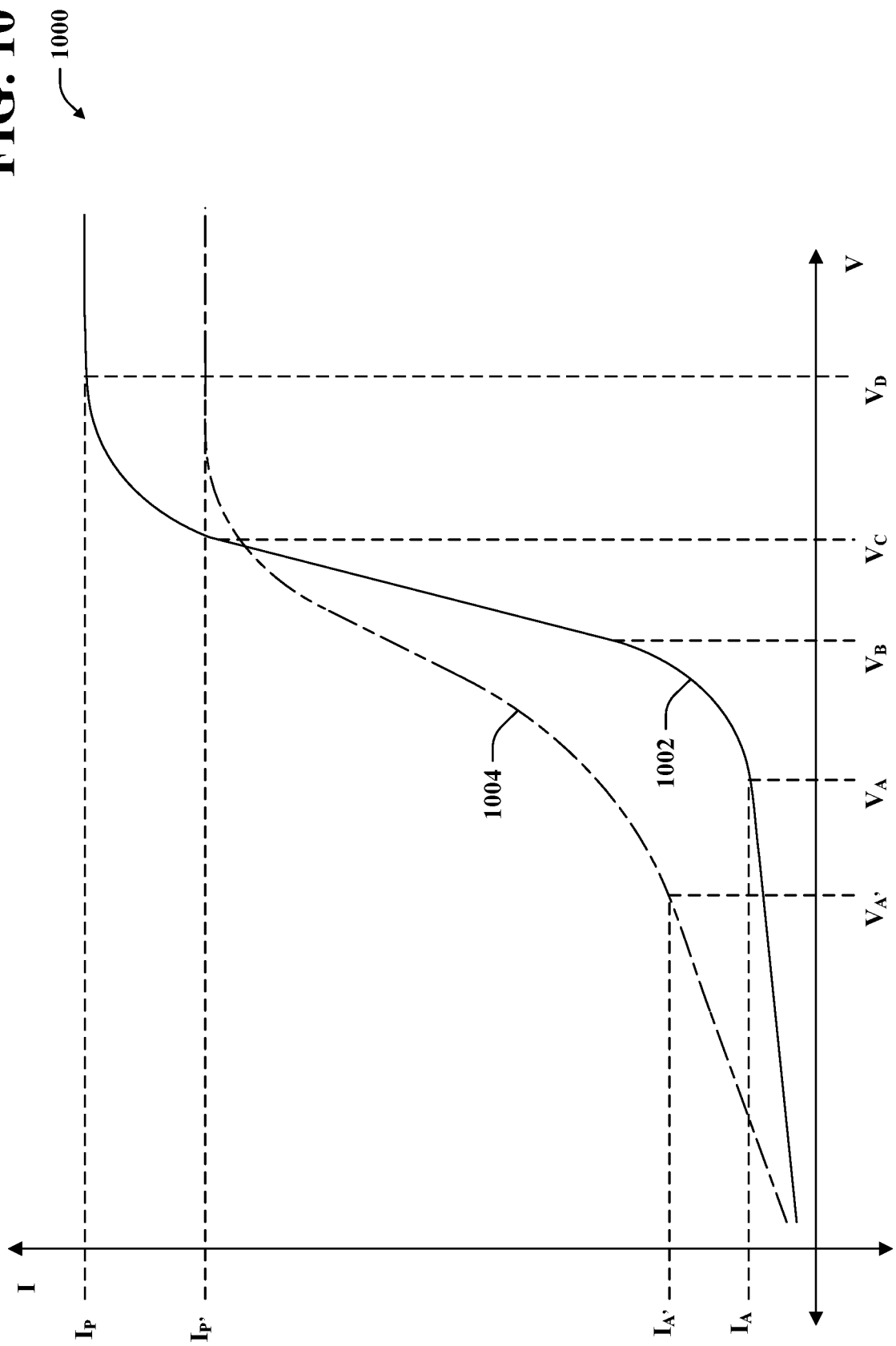
FIG. 10 is an exemplary plot of current-voltage relationships in a channel layer of an ionic redox transistor.

Referring now to FIG. 10, exemplary plots 1002, 1004 of current-voltage relationships of a channel layer of an ionic redox transistor that is configured to undergo an IMT is shown. The plot 1002 illustrates current through a channel layer plotted against voltage across the channel layer when the channel layer has a first concentration of ions. Thus, the plot 1002 depicts a first current-voltage relationship for the channel layer. Below a threshold voltage, $V_A$, the channel layer exhibits a substantially linear current-voltage relationship. The threshold voltage $V_A$ can be a voltage at which an IMT occurs in the channel layer in response to the channel layer being electrically stimulated by the voltage across the channel layer. Referring again to FIG. 1, the threshold voltage below which the channel layer 102 of the redox transistor 100 exhibits a substantially linear current-voltage relationship depends upon material composition of the channel layer 102 and, as will be explained in greater detail below, an oxidation state of the channel 102. In exemplary embodiments, the channel layer 102 can exhibit a substantially linear current-voltage relationship when the voltage across the channel layer 102 is between 0V and 0.5V, between 0V and 0.25V, or between 0V and 0.1V. In further embodiments, below the threshold voltage the current I through the channel layer can be less than 1 µA, less than 500 nA, or less than 100 nA. In further exemplary embodiments, the channel layer 102 can exhibit a nonlinear current-voltage relationship when the voltage across the channel layer is greater than 0.5V, greater than 1V, or greater than 2.5V. In some embodiments, within the nonlinear region of operation the channel current I can vary from 1 µA to 50 mA.

The ionic redox transistor 100 can function as a synapse device when the voltage across the channel 102 (e.g., applied between the source 108 and the drain 110) is below an IMT threshold voltage of the channel 102 (e.g., the voltage $V_A$ in the plot 1002), where the channel 102 is in the region of substantially linear current-voltage operation. In response to an input voltage that is below the IMT threshold voltage being applied across the channel 102, an output current I from the channel 102 is proportional to the input voltage. Thus, in response to a voltage input at the channel 102 that is below the IMT threshold voltage, the ionic redox transistor outputs a current I the value of which is given by the input voltage multiplied by a weight. The weight applied to the voltage input is equal to the slope of the substantially linear current-voltage relationship, and is a function of the oxidation state of the channel layer 102 (i.e., a concentration of ions, such as oxygen vacancies, in the channel layer 102).

Referring again to FIG. 10, as indicated by the plot 1002, above the IMT threshold voltage $V_A$ the channel layer exhibits a nonlinear current-voltage relationship. Between the threshold voltage $V_A$ and a voltage $V_B$ lies a first inflection region in which the rate of change of current through the channel layer against voltage applied across the channel layer, di/dv, increases. Accordingly, the conductance of the channel layer 102 increases within the first inflection region between $V_A$ and $V_B$. In some embodiments, the current-voltage relationship of the channel layer can have a second linear region between $V_B$ and a third voltage $V_C$, where voltages between $V_B$ and $V_C$ are above the IMT threshold voltage $V_A$. Above $V_C$, the current-voltage relationship in the channel layer exhibits a second inflection region and di/dv decreases. In some embodiments, above a threshold voltage $V_D$ the current-voltage relationship can be substantially linear again. In more specific embodiments, above the threshold voltage $V_D$ the current can be substantially constant.

The ionic redox transistor 100 can function as a neuron device in a spiking mode or a non-spiking mode when the voltage applied across the channel layer 102 is above an IMT threshold voltage. When the ionic redox transistor 100 receives input signals (e.g., voltages applied across the channel layer 102) that collectively exceed an activation threshold voltage, the ionic redox transistor 100 outputs a signal (e.g., a current I through the channel layer 102). Referring again to FIG. 10, a threshold at which the ionic redox transistor 100 is considered to be "activated" when functioning as a neuron device can be the IMT threshold voltage $V_A$, any voltage greater than the voltages in the first inflection region (e.g., voltages greater than the voltage $V_B$), or any voltage greater than the voltage $V_C$ at which the second inflection region begins.

As indicated above, channel current for channel voltages below an IMT threshold voltage can be on the order of nanoamps. By contrast, channel current for channel voltages above the IMT threshold voltage can be on the order of tens of microamps or milliamps. Hence, the channel current I of the ionic redox transistor 100 when the ionic redox transistor 100 operates as a neuron device can be much higher than when the ionic redox transistor 100 operates as a synapse device. For instance, and referring again to FIG. 10, a peak current $I_P$ of a channel layer can be at least 1000 times greater than a maximum current $I_A$ through the channel layer within the region of substantially linear current-voltage relationship in the channel layer. Thus, the small channel currents output by the ionic redox transistor 100 when the ionic redox transistor 100 is subject to channel voltages below the IMT threshold voltage generally do not inhibit functionality of the ionic redox transistor 100 as a neuron device, since the "activated" current of the ionic redox transistor 100 when functioning as a neuron device is much higher than channel currents in the synapse regime below the IMT threshold voltage.

As indicated above, features of the current-voltage relationship of the channel layer 102 in its various regions of operation can be modified by changing the concentration of ions in the channel layer 102. The plot 1004 illustrates a second current-voltage relationship for the same channel layer represented by the plot 1002 when the channel layer has a second concentration of ions. By way of example, and not limitation, the plot 1004 can be representative of a second current-voltage relationship for a channel formed from $VO_2$ that has a higher concentration of oxygen vacancies than when the channel has the first current-voltage relationship reflected by the plot 1002. The second current-voltage relationship characterized by the plot 1004 can exhibit various differences from the first current-voltage relationship characterized by the plot 1002. For instance, the second current-voltage relationship can have a lower IMT threshold voltage $V_{A'}$ at which a transition occurs between a substantially linear current-voltage relationship to a nonlinear current-voltage relationship, and a higher corresponding current $I_{A'}$. Additionally, a slope of the substantially linear portion of the second current-voltage relationship (i.e., at voltages less than $V_A$) can be higher than a slope of the substantially linear portion of the first current-voltage relationship (i.e., at voltages less than $V_A$). Furthermore, a peak current $I_P$, in the second current-voltage relationship of the plot 1004 can be less than the peak current $I_P$ of the first current-voltage relationship shown in the plot 1002. From the foregoing, a concentration of the ions in the channel layer 102 of the ionic redox transistor 100 can be used to tune an activation function of the ionic redox transistor 100 when it functions as a neuron device. Therefore, the activation function of an ionic redox transistor 100 functioning as a neuron device can be controlled by way of a write voltage $V_{WRITE}$ as described in detail above.

It is to be understood that in some embodiments, whether the channel layer 102 exhibits a nonlinear voltage-current relationship above a threshold voltage across the channel layer 102 can depend on a concentration of the ions in the channel layer 102. For example, at some ion concentrations, the channel layer 102 can have a substantially linear current-voltage relationship for all voltages. In other words, for some concentrations of ions in the channel layer 102, the channel layer 102 may not undergo IMT.

Various materials that undergo an IMT can be used to form the channel layer 102. In a non-limiting example, the channel layer 102 can be formed from $VO_2$. Whereas it has been demonstrated that doping of $VO_2$ at a fabrication stage of a layer of $VO_2$ in a device can affect a voltage threshold for IMT in the layer, variability in doping processes generally prevents consistent and predictable voltage thresholds of the layers across a group of manufactured devices. By contrast, the ionic redox transistor 100, when constructed with a $VO_2$ channel layer 102, can be controlled to change a concentration of oxygen vacancies in the $VO_2$, thereby changing a threshold voltage at which IMT occurs. Therefore, the ionic redox transistor 100 can be tuned, subsequent to manufacture, to have any of various different activation functions when functioning as a neuron device. Materials other than $VO_2$ that are suitable for forming the channel layer 102 to undergo an IMT include, but are not limited to, niobium dioxide ($NbO_2$), alloys of $VO_2$, alloys of $NbO_2$, or materials having a perovskite structure. In various embodiments, the channel layer 102 can be formed from an alloy of $VO_2$ and any of titanium, aluminum, gallium, or indium. Further materials that are suitable for forming the channel layer 102 to undergo an IMT include rare earth perovskite materials with the composition $RNiO_3$, where R is one of samarium (Sm), praseodymium (Pr) or neodymium (Nd). Still further materials that are suitable for forming the channel layer 102 to undergo an IMT include $Li_xTiO_2$ and $H_xTiO_2$. In such embodiments, a threshold voltage at which IMT occurs can be controlled by changing a concentration of lithium or hydrogen ions, respectively. It is to be understood that materials used to form the reservoir layer 104 and the electrolyte layer 106 are adapted to accommodate transport of a mobile ion in the channel layer 102. For instance, it is to be understood that in embodiments wherein the channel layer 102 is formed from $Li_xTiO_2$ and $H_xTiO_2$, materials selected for construction of the reservoir layer 104 and the electrolyte layer 106 are adapted for transport of lithium or hydrogen ions.

Figure 11:
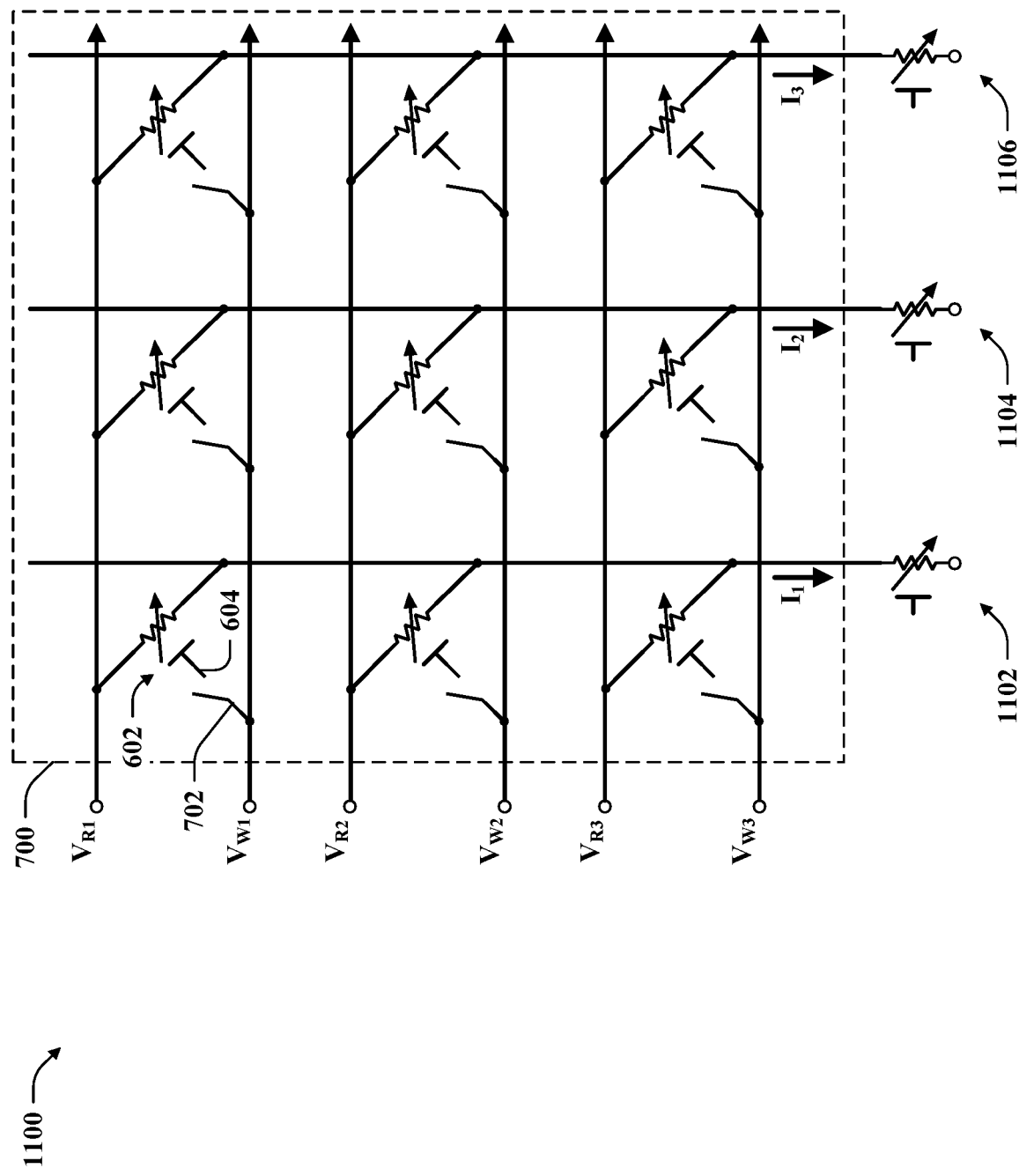
FIG. 11 is a partial circuit diagram of an exemplary neuromorphic computing architecture.

Referring now to FIG. 11, an exemplary neuromorphic computing device 1100 is illustrated. The device 1100 includes the array 700 configured as described above. In the array 700, the ionic redox transistors (e.g., the transistor 602) can be operated as synapse devices. For example, each of the read voltages $V_{R1}$, $V_{R2}$, and $V_{R3}$ can be maintained below the IMT transition voltage associated with each of the ionic redox transistors of the array 700. The device 1100 includes an additional plurality of ionic redox transistors 1102-1106. Each of the ionic redox transistors 1102-1106 is configured to receive, at its channel layer, the current output by a respective column of the array 700. For instance, the ionic redox transistor 1102 receives the current $I_1$ output by a first column of the array 700, the ionic redox transistor 1104 receives the current $I_2$ output by a second column of the array 700, and the ionic redox transistor 1106 receives the current $I_3$ output by a third column of the array 700. In embodiments wherein the ionic redox transistors of the array 700 are operated as synapse devices, the currents $I_1$-$I_3$ are weighted sums of the voltages $V_{R1}$, $V_{R2}$, $V_{R3}$. By way of example, the current $I_1$ can be defined by the following equation:

$$I_1 = w_1 V_{R1} + w_2 V_{R2} + w_3 V_{R3} \qquad \text{Eq. 1}$$

where $w_1$ is the weight of the ionic redox transistor in the first row and first column of the array 700, $w_2$ is the weight of the ionic redox transistor in the second row and first column of the array 700, and $w_3$ is the weight of the ionic redox transistor in the third row and first column of the array 700, the weights being based upon the concentration of ions in the channel layers of the ionic redox transistors of the array 700. An output of the ionic redox transistor 1102 is based upon the outputs of the ionic redox transistors in the first column of the array 700, collectively $I_1$. When $I_1$ is sufficiently large, the channel layer of the ionic redox transistor 1102 undergoes an IMT and operates with a nonlinear current-voltage relationship, activating a neuron output of the ionic redox transistor 1102.

Referring now to FIG. 12, an exemplary methodology 1200 for operating a same ionic redox transistor as both a synapse device and a neuron device is illustrated. The methodology 1200 begins at 1202, and at 1204 a first voltage is applied between a first contact and a second contact that are positioned at opposite ends of a channel layer. The first voltage can be a voltage in a first range of voltages that, when applied between the first contact and the second contact cause the channel layer to exhibit a linear current-voltage relationship. When a voltage in the first range of voltages is applied between the contacts, the channel layer functions as a synapse device, outputting a current that is proportional to the applied voltage. The weight of the synapse device, or the slope of the linear current-voltage relationship, is a function of a concentration of mobile ions in the channel layer. The channel layer can be included in an ionic redox transistor that also includes a reservoir layer and an electrolyte layer positioned between the channel layer and the reservoir layer. In exemplary embodiments, responsive to a voltage being applied between a gate contact affixed to the reservoir layer and one of the first or second channel contacts, an ion migrates from the reservoir layer to the channel layer, or vice versa, thereby changing a weight of the ionic redox transistor when operating as a synapse device.

At 1206, a second voltage is applied between the first contact and the second contact. The second voltage is a voltage in a second range of voltages that, when applied to the channel layer, cause the channel layer to exhibit a nonlinear current-voltage relationship. The channel layer can exhibit the nonlinear current-voltage relationship due to an IMT occurring in the channel layer as a result of the applied channel voltage. In a non-limiting example, the nonlinear current-voltage relationship can be characterized by a first inflection region in which the derivative of the channel current with respect to channel voltage increases and a second inflection region at higher voltages than the first inflection region in which the derivative of the channel current with respect to channel voltage decreases. When a voltage in the second range of voltages is applied between the contacts of the channel layer, the channel layer can function as a neuron device. Hence, below an activation threshold voltage, a current through the channel layer is low (e.g., less than 1 µA, less than 500 nA, or less than 100 nA), while above an activation threshold voltage, the current through the channel layer can be orders of magnitude higher (e.g., several milliamps). An activation function of the channel layer when functioning as a neuron device can be changed by changing the concentration of mobile ions in the channel layer. For example, the activation threshold voltage at which the channel layer "activates" as a neuron can be increased or decreased by changing the concentration of the mobile ions in the channel. At 1208, the methodology 1200 ends.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim

What is claimed is:

1. A device for neuromorphic computing, comprising:
    a first ionic redox transistor and a second ionic redox transistor, where each of the first ionic redox transistor and the second ionic redox transistor comprises:
        a channel layer having a first end and a second end;
        a first contact positioned at the first end of the channel layer;
        a second contact positioned at the second end of the channel layer, wherein:
            the first ionic redox transistor is configured to operate as a synapse in a neural network based upon a first voltage in a first range of voltages being applied between the first contact and the second contact of the first ionic redox transistor, where the channel layer of the first ionic redox transistor exhibits a substantially linear current-voltage relationship in response to the first voltage being applied between the first contact and the second contact of the first ionic redox transistor; and
            the second ionic redox transistor is configured to operate as an activation function in the neural network based upon a second voltage in a second range of voltages being applied between the first contact and the second contact of the second ionic redox transistor, where the channel layer exhibits a nonlinear current-voltage relationship in response to the second voltage being applied between the first contact and the second contact of the second ionic redox transistor, the second range of voltages being higher than the first range of voltages.

2. The device of claim 1, where each of the first ionic redox transistor and the second ionic redox transistor further comprises:
    a reservoir layer; and
    an electrolyte layer positioned between the reservoir layer and the channel layer, the reservoir layer and the channel layer comprising a mobile ion, wherein the electrolyte layer is configured to permit transport of the mobile ion across the electrolyte layer.

3. The device of claim 2, where each of the first ionic redox transistor and the second ionic redox transistor further comprises a third contact positioned on the reservoir layer, wherein responsive to a voltage being applied between the third contact and one of the first or second contacts, the mobile ion migrates from the reservoir layer to the channel layer or from the channel layer to the reservoir layer, wherein migration of the mobile ion causes the substantially linear current-voltage relationship of the channel in the first ionic redox transistor and the nonlinear current-voltage relationship of the channel in the second ionic redox transistor to change.

4. The device of claim 3, wherein migration of the mobile ion causes a slope of the substantially linear current-voltage relationship in the first ionic redox transistor to change.

5. The device of claim 3, wherein migration of the mobile ion causes a peak current of the nonlinear current-voltage relationship in the second ionic redox transistor to change.

6. The device of claim 3, wherein migration of the mobile ion causes an activation voltage of the nonlinear current-voltage relationship in the second ionic redox transistor to change.

7. The device of claim 2, wherein the mobile ion is oxygen vacancies.

8. The device of claim 1, wherein the channel layer comprises vanadium dioxide ($VO_2$).

9. The device of claim 8, wherein the channel layer comprises $VO_2$ alloyed with an element selected from a list consisting of:
    titanium;
    aluminum;
    gallium; and
    indium.

10. The device of claim 1, wherein the channel layer comprises niobium dioxide ($NbO_2$).

11. The device of claim 1, wherein the channel layer comprises a rare earth perovskite material with the composition $RNiO_3$ where R is one of samarium (Sm), praseodymium (Pr) or neodymium (Nd).

12. The device of claim 1, wherein the first range of voltages extends from 0V to 0.5V.

13. The device of claim 1, wherein the first range of voltages extends from 0V to 0.25V.

14. The device of claim 1, wherein the first range of voltages extends from 0V to 0.1V.

15. The device of claim 1, wherein the second range of voltages is greater than 0.5 V.

16. The device of claim 1, wherein the second range of voltages is greater than 2.5 V.

17. A method, comprising:
    applying a first voltage between a first contact and a second contact, the first voltage being within a first range of voltages, the first contact and the second contact positioned at opposite ends of a channel layer, wherein responsive to the first range of voltages being applied between the first contact and the second contact, the channel layer exhibits a linear current-voltage relationship; and applying a second voltage between the first contact and the second contact, the second voltage being within a second range of voltages, the second range of voltages non-overlapping with the first range of voltages, and wherein responsive to the second range of voltages being applied between the first contact and the second contact, the channel layer exhibits a nonlinear current-voltage relationship.

18. A device for neomorphic computing comprising:

a first ionic redox transistor comprising:

a first channel layer;

a first contact coupled to the first channel layer at a first side of the first channel layer; and a second contact coupled to the first channel layer at a second side of the first channel layer, where the first ionic redox transistor is configured to generate a first output based upon a first voltage applied between the first contact and the second contact, where the first ionic redox transistor is configured to operate as a synapse in a neural network based upon the first voltage being within a first range of voltages;

a second ionic redox transistor comprising:

a second channel layer;

a third contact coupled to the second channel layer at a first side of the second channel layer;

a fourth contact coupled to the second channel layer at a second side of the second channel layer, where the second ionic redox transistor is configured to generate a second output based a second voltage applied between the third contact and the fourth contact, where the second ionic transistor is configured to act as an activation function in the neural network based upon the second voltage being within a second range of voltages that is higher than the first range of voltages, and further where the second voltage is based upon the first output.

19. The device of claim 18, where the first channel layer and the second channel layer comprise vanadium dioxide ($VO_2$).

20. The device of claim 18, wherein the first channel layer and the second channel layer comprise a rare earth perovskite material with the composition $RNiO_3$ where R is one of samarium (Sm), praseodymium (Pr) or neodymium (Nd).

* * * * *